(12) United States Patent
Mamitsu et al.

(10) Patent No.: US 8,278,747 B2
(45) Date of Patent: Oct. 2, 2012

(54) SEMICONDUCTOR APPARATUS HAVING A TWO-SIDE HEAT RADIATION STRUCTURE

(75) Inventors: Kuniaki Mamitsu, Okazaki (JP); Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 312 days.

(21) Appl. No.: 12/453,784

(22) Filed: May 21, 2009

(65) Prior Publication Data

US 2009/0289351 A1    Nov. 26, 2009

(30) Foreign Application Priority Data

May 22, 2008 (JP) ................. 2008-134005

(51) Int. Cl.
*H01L 23/48* (2006.01)

(52) U.S. Cl. ........ 257/690; 257/678; 257/692; 257/706; 257/707

(58) Field of Classification Search ............. 257/678, 257/690, 692, 706, 707
See application file for complete search history.

(56) References Cited

U.S. PATENT DOCUMENTS

| | | | |
|---|---|---|---|
| 6,891,265 B2 * | 5/2005 | Mamitsu et al. ............. 257/718 |
| 2003/0122232 A1 * | 7/2003 | Hirano et al. ............. 257/678 |
| 2003/0132530 A1 | 7/2003 | Teshima et al. | |
| 2004/0070060 A1 | 4/2004 | Mamitsu et al. | |
| 2004/0070072 A1 | 4/2004 | Mamitsu et al. | |
| 2004/0089925 A1 | 5/2004 | Fukuda et al. | |
| 2004/0089940 A1 | 5/2004 | Mamitsu et al. | |
| 2004/0089941 A1 | 5/2004 | Mamitsu et al. | |
| 2004/0089942 A1 | 5/2004 | Mamitsu et al. | |
| 2004/0097082 A1 | 5/2004 | Mamitsu et al. | |
| 2005/0056927 A1 | 3/2005 | Teshima et al. | |
| 2005/0167821 A1 | 8/2005 | Mamitsu et al. | |
| 2006/0145335 A1 | 7/2006 | Teshima et al. | |
| 2008/0007920 A1 * | 1/2008 | Shiraki et al. ............. 361/717 |
| 2008/0116590 A1 | 5/2008 | Matsuoka | |

FOREIGN PATENT DOCUMENTS

| | | |
|---|---|---|
| JP | A-2002-319654 | 10/2002 |
| JP | A-2007-073583 | 3/2007 |
| JP | A-2008-098654 | 4/2008 |

OTHER PUBLICATIONS

Office Action mailed May 11, 2010 issued from the Japan Patent Office in the corresponding patent application No. 2008-134005 (and English translation).

* cited by examiner

*Primary Examiner* — Jae Lee
(74) *Attorney, Agent, or Firm* — Posz Law Group, PLC

(57) ABSTRACT

A semiconductor apparatus having a first surface and a second surface opposite to the first surface includes: a semiconductor chip having a front side and a backside; a first heat radiation member electrically and thermally coupled with the backside of the chip; a second heat radiation member electrically and thermally coupled with the front side of the chip; and a resin mold sealing the first and second heat radiation members together with the chip. At least one of the first and second heat radiation members is exposed on both of the first and second surfaces.

17 Claims, 14 Drawing Sheets

SEMICONDUCTOR APPARATUS HAVING A TWO-SIDE HEAT RADIATION STRUCTURE

CROSS REFERENCE TO RELATED APPLICATION

This application is based on Japanese Patent Application No. 2008-134005 filed on May 22, 2008, the disclosure of which is incorporated herein by reference.

FIELD OF THE INVENTION

The present invention relates to a semiconductor apparatus having a both-side heat radiation structure and a method for manufacturing a semiconductor apparatus having a both-side heat radiation structure. The apparatus includes a semiconductor chip, which is sandwiched between a pair of heat radiation members, and sealed with a resin mold.

BACKGROUND OF THE INVENTION

Conventionally, a semiconductor apparatus having a both-side heat radiation structure is disclosed in JP-A-2001-156225 corresponding to US 2005/0167821. The apparatus includes a semiconductor chip, which is sandwiched between a pair of heat radiation members so that the heat is radiated from both sides of the chip. In the apparatus, the chip is sandwiched between the radiation members via a connection member. The chip together with the heat radiation members are sealed with a resin mold so as to expose a heat radiation surface of each heat radiation member from the resin mold. The heat radiation surface of the radiation member is opposite to a mounting surface of the radiation member. The chip is mounted on the mounting surface of the radiation member.

A manufacturing method of the apparatus will be explained. First, the chip is bonded on one heat radiation member. Then, the other heat radiation member is bonded to the chip such that the one heat radiation member is spaced apart from the other heat radiation member by a predetermined distance. Then, the chip with the heat radiation members is arranged in a die such that the heat radiation surface of one of the heat radiation members contacts the die. In this case, the heat radiation surface of the other heat radiation member does not contact the die so that a gap between the other heat radiation member and the die is formed. If the die sandwiches both heat radiation members, force for pressing the heat radiation surface with the die is directly transmitted to the chip, so that the chip may be damaged. Thus, it is necessary to provide the gap between the other heat radiation member and the die. Then, resin material is inserted into the die, and the resin material is hardened.

Then, resin burr of the resin mold in the gap between the heat radiation surface of the other heat radiator member and the die is removed. Dimensions of each heat radiation member are controlled such that a shape tolerance of each heat radiation surface such as a parallelism between two heat radiation surfaces, a flatness of each heat radiation surface, a positional relationship between the heat radiation surfaces, and a thickness of the other heat radiation member is disposed within a predetermined accuracy range. Thus, the semiconductor apparatus is completed.

However, since the die does not tightly sandwich or hold the heat radiation members so as not to damage the semiconductor chip, it is necessary to remove the resin burr formed on the heat radiation surface of the other heat radiation member so that the semiconductor apparatus having both-side heat radiation structure is obtained.

When the resin burr is removed, it is necessary to perform a step for adjusting the shape tolerance of the heat radiation surfaces. Accordingly, it is necessary to control quality of an assembling step of the heat radiation members and the semiconductor chip, and further, to control the shape tolerance of each heat radiation member with high accuracy.

Thus, it is required to manufacture a semiconductor apparatus having a both-side heat radiation structure with high accuracy of shape tolerance without a step for removing a resin burr of a resin mold and without a step for adjusting a shape tolerance with high accuracy.

SUMMARY OF THE INVENTION

In view of the above-described problem, it is an object of the present disclosure to provide a semiconductor apparatus having a both-side heat radiation structure with high accuracy of shape tolerance.

According to a first aspect of the present disclosure, a semiconductor apparatus having a first surface and a second surface opposite to the first surface, includes: a semiconductor chip having a front side and a backside; a first heat radiation member electrically and thermally coupled with the backside of the chip; a second heat radiation member electrically and thermally coupled with the front side of the chip; and a resin mold sealing the first and second heat radiation members together with the chip. At least one of the first and second heat radiation members is exposed on both of the first and second surfaces.

When the above apparatus is manufactured, at least one of the first and second heat radiation members is clamped with dies in such a manner that clamp force is only applied to the at least one of the first and second heat radiation members. Accordingly, the clamp force is not directly applied to the semiconductor chip, so that the chip is not damaged by the clamp force. Further, since the at least one of the first and second heat radiation members is exposed on both of the first and second surfaces so that the apparatus has a both-side heat radiation structure, it is not necessary to remove a resin burr when the apparatus is manufactured. Thus, dimensional control of the apparatus is determined by only assembling control of the semiconductor chip in the heat radiation members. The apparatus has high accuracy of shape tolerance in the heat radiation members.

According to a second aspect of the present disclosure, a method for manufacturing a semiconductor apparatus having a first surface and a second surface opposite to the first surface, the method includes: electrically and thermally coupling a first heat radiation member and a backside of a semiconductor chip; electrically and thermally coupling a second heat radiation member and a front side of the chip; sandwiching the first and second heat radiation members between a first die and a second die, wherein the sandwiching includes mounting the first and second heat radiation members in a first concavity of the first die in such a manner that a first heat radiation surface of the first heat radiation member and a third heat radiation surface of the second heat radiation member contact a bottom of the first concavity of the first die, and mounting the first and second heat radiation members in the second concavity of a second die in such a manner that a second heat radiation surface of the first heat radiation member and a fourth heat radiation surface of the second heat radiation member contact a bottom of the second concavity of the first die; and pouring resin material into the first concavity of the first die and the second concavity of the second die so that the first and second heat radiation members and the chip are sealed with a resin mold in such a manner that at least one of the first and second heat radiation members is exposed on both of the first and second surfaces. The first heat radiation surface of the first heat radiation member is exposed on the first surface and the second heat radiation surface of the first heat radiation member is exposed on the second surface, or the third heat radiation surface of the second heat radiation member is exposed on the first surface and the fourth heat radiation surface of the second heat radiation member is exposed on the second surface. In this method, it is not necessary to remove resin burr. Further, dimensional control of the apparatus is determined by only dimensional control of shape tolerance of the heat radiation member. Thus, the apparatus has high accuracy of shape tolerance in the heat radiation members.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
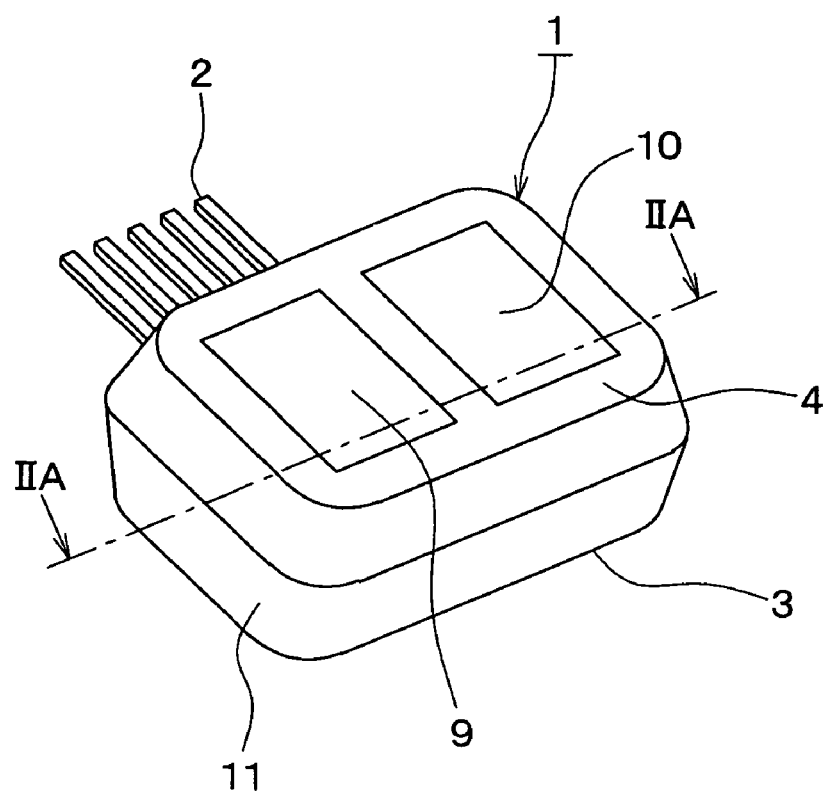
FIG. 1 is a diagram showing a semiconductor apparatus according to a first embodiment.

A semiconductor apparatus 1 according to a first embodiment is shown in FIG. 1. The apparatus 1 is suitably used for inverter control in a hybrid vehicle.

Figure 2A:
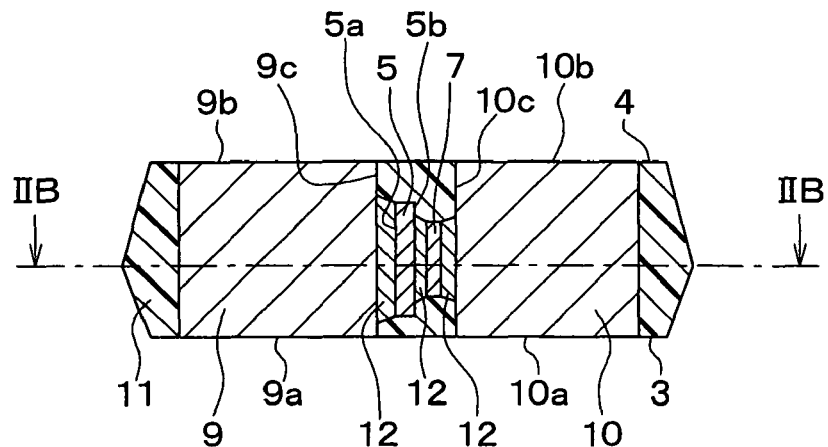
FIG. 2A is a cross sectional view showing the apparatus taken along line IIA-IIA in FIG. 1.

The appearance of the apparatus 1 is a chip shape. The apparatus 1 includes a terminal 2 for electrically coupling with an external circuit. As shown in FIG. 2Am the apparatus 1 has a first surface 3 and a second surface 4, which is opposite to the first surface 3.

Figure 2B:
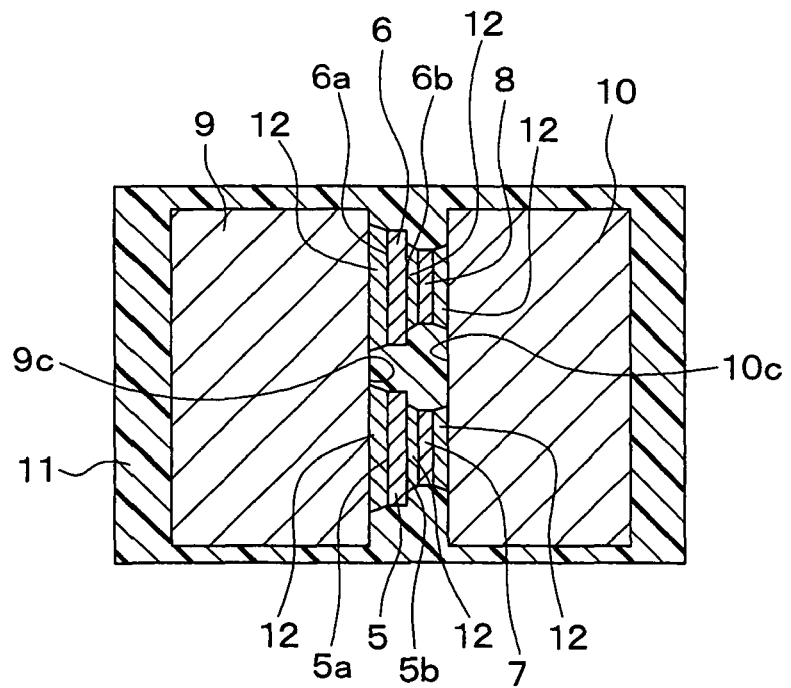
FIG. 2B is a cross sectional view showing the apparatus taken along line IIB-IIB in FIG. 2A.

As shown in FIG. 2B, the apparatus 1 further includes a first semiconductor chip 5, a second semiconductor chip 6, a first terminal 7, a second terminal 8, a first heat radiation member 9, a second heat radiation member 10 and a resin mold 11.

The semiconductor chip 5, 6 includes a semiconductor element such as an IGBT, a MOS transistor, a diode and the like. An electrode for soldering is formed on a principal surface and/or a rear surface of the chip.

Each terminal 7, 8 is electrically and thermally coupled with the second heat radiation member 10 and the semiconductor chips 5, 6. Accordingly, the terminal 7, 8 functions as a wiring and functions as a heat radiation block. The terminal 7, 8 is made of, for example, copper and formed from a metal plate by a press processing method.

The heat radiation member 9, 10 functions as a heat sink for discharging heat generated in the chips 5, 6 to an outside of the apparatus 1 and functions as an electrode for electrically coupling with the chips 5, 6 and the external circuit.

The first heat radiation member 9 has a first heat radiation surface 9a, a second heat radiation surface 9b and a first mounting surface 9c. The first heat radiation surface 9a is exposed on the first surface 3 of the apparatus 1. The second heat radiation surface 9b is exposed on the second surface 4 of the apparatus 1. The first mounting surface 9c is perpendicular to the first and second heat radiation surfaces 9a, 9b. The second heat radiation member 10 has a third heat radiation surface 10a, a fourth heat radiation surface 10b and a second mounting surface 10c. The third heat radiation surface 10a is exposed on the first surface 3 of the apparatus 1. The fourth heat radiation surface 10b is exposed on the second surface 4 of the apparatus 1. The second mounting surface 10c is perpendicular to the third and fourth heat radiation surfaces 10a, 10b.

The heat radiation members 9, 10 are formed from a metal plate by a press processing method. The heat radiation member 9, 10 has a plate shape or a block shape. Thus, the shape of each member 9, 10 is a rectangular parallelepiped shape or a cubic shape. In this case, the shape accuracy of the member 9, 10 is high, and quality control of dimensional accuracy in the member 9, 10 is easily performed. Specifically, the thickness of each heat radiation member 9, 10, a positional relationship between the heat radiation members 9, 10, and the parallelism and the flatness of each heat radiation member 9, 10 are substantially determined based on the shape accuracy of the member 9, 10 itself.

The material of the heat radiation member 9, 10 and the material of the terminal 7, 8 have conductivity, and therefore, the material may be copper, aluminum or their alloy. Each mounting surface 10c, 9c of the heat radiation members 9, 10 may be covered with a nickel plating film or a gold plating film as a surface processing of soldering.

Each chip 5, 6, each terminal 7, 8 and each heat radiation member 9, 10 are electrically and/or thermally coupled with a connecting member 12 such as solder. Specifically, the backside 5a of the first semiconductor chip 5 is bonded to the first mounting surface 9c of the first heat radiation member 9 via the connecting member 12. The front side 5b of the first semiconductor chip 5 is bonded to the first terminal 7 via the connecting member 12. The first terminal 7 is bonded to the second mounting surface 10c of the second heat radiation member 10 via the connecting member 12. The connecting member 12 may be made of silver paste or the like.

The backside 6a of the second semiconductor chip 6 is bonded to the first mounting surface 9c of the first heat radiation member 9 via the connecting member 12. The front side 6b of the second semiconductor chip 6 is bonded to the second terminal 8 via the connecting member 12. The second terminal 8 is bonded to the second mounting surface 10c via the connecting member 12.

The resin mold 11 provides the appearance of the apparatus 1. The resin mold 11 seals the chips 5, 6, the terminals 7, 8 and the heat radiation members 9, 10 such that the first heat radiation surface 9a, the third heat radiation surface 10a are exposed on the first surface 3 of the apparatus, and the second heat radiation surface 9b and the fourth heat radiation surface 10b are exposed on the second surface 4 of the apparatus 1. The material of the resin mold 11 is, for example, epoxy series resin.

A manufacturing method of the apparatus 1 will be explained with reference to FIGS. 3A to 3F and 4. FIGS. 3D to 3F are views seeing from a right side of FIGS. 3A to 3C, respectively.

First, the semiconductor chips 5, 6, the terminals 7, 8, the heat radiation members 9, 10 and a terminal 2 for coupling with the external circuit are prepared. The dimensional accuracy of shape tolerance of each heat radiation member 9, 10 is comparatively high. Thus, the members 9, 10 having the thickness of each heat radiation member 9, 10, the positional relationship between the heat radiation members 9, 10, and the parallelism and the flatness of the heat radiation members 9, 10 with high accuracy are prepared by the press processing method.

Figure 3A:
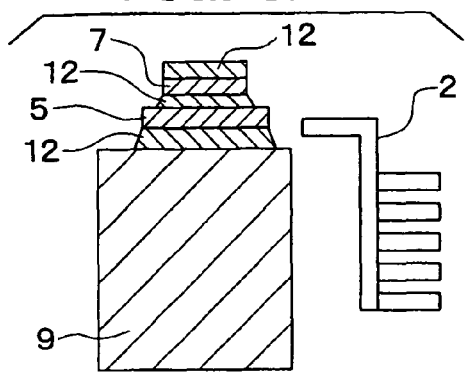
FIGS. 3A to 3C are cross sectional views corresponding to FIG. 2B and showing a manufacturing method of the apparatus.
Figure 3D:
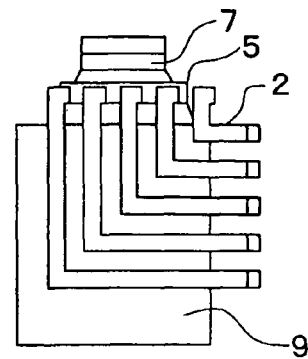
FIGS. 3D to 3F are rear views corresponding to FIGS. 3A to 3C.

In a step shown in FIGS. 3A and 3D, the first and second semiconductor chips 5, 6 are mounted on the first mounting surface 9c of the first heat radiation member 9 via the connecting member 12. Further, the terminal 7, 8 is mounted on the chip 5, 6. The connecting member 12 for bonding the second heat radiation member 10 is mounted on each terminal 7, 8. This assembly together with the terminal 2 for coupling with the external circuit is fixed to a jig (not shown).

Figure 3B:
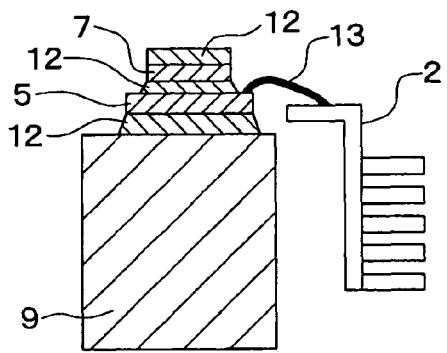
Figure 3E:
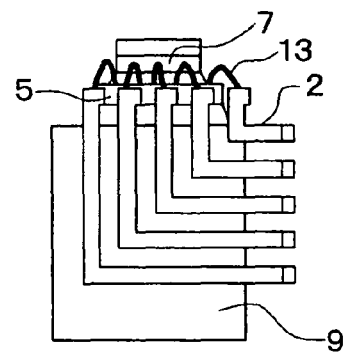

In a step shown in FIGS. 3B and 3E, the chips 5, 6 are connected to the terminal 2 via a bonding wire 13.

Figure 3C:
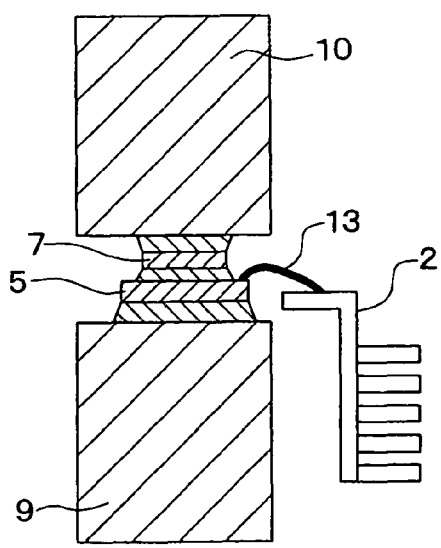
Figure 3F:
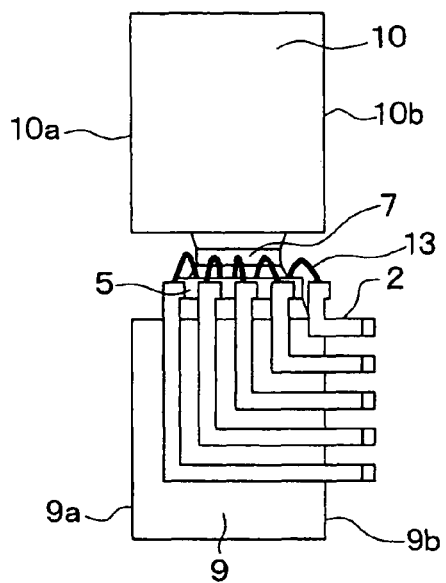

In a step shown in FIGS. 3C and 3F, by using a jig (not shown), the second heat radiation member 10 is bonded to the terminals 7, 8 via the connecting member 12. The assembling of the second heat radiation member 10 is performed such that the first heat radiation surface 9a of the first heat radiation member 9 and the third heat radiation surface 10a of the second heat radiation member 10 are arranged on the same plane, and the second heat radiation surface 9b of the first heat radiation member 9 and the fourth heat radiation surface 10b of the second heat radiation member 10 are arranged on the same plane.

The assembling control provides the accuracy of the shape tolerance of the apparatus 1. Here, the assembling control is, for example, control of the thickness of the apparatus 1 such as the distance between the first and third heat radiation surfaces 9a, 10a exposed on the first surface 3 of the apparatus 1 and the second and third heat radiation surfaces 9b, 10b exposed on the second surface 4 of the apparatus 1, and control of flatness of the heat radiation surfaces 9a, 9b, 10a, 10b.

Figure 4:
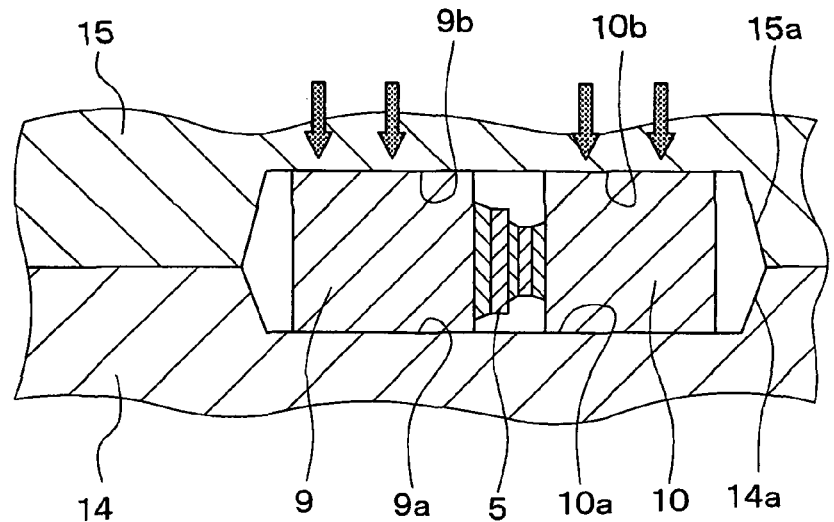
FIG. 4 is a cross sectional view corresponding to FIG. 2B and showing the manufacturing method of the apparatus.

Then, as shown in FIG. 4, the resin mold 11 is formed. First, the first die 14 having a concavity 14a and the second die 15 having another concavity 15a are prepared. An assembly shown in FIGS. 3C and 3F is mounted on the bottom of the concavity 14a of the first die 14 in such a manner that the heat radiation surfaces 9a, 10a to be exposed on the first surface 3 contacts the bottom of the concavity 14a. Then, the assembly is sandwiched between the first and second dies 14, 15 in such a manner that the heat radiation surfaces 9b, 10b to be exposed on the second surface 4 contacts the bottom of the concavity 15a of the second die 15. In this case, the terminal 2 is sandwiched between the first and second dies 14, 15.

The second die 15 and the first die 14 are clamped in the direction shown as an arrow in FIG. 4. The clamp force applied to each die 14, 15 is directly applied to the heat radiation members 9, 10. However, the clamp force is not applied to the semiconductor chips 5, 6 directly. Thus, the chip 5, 6 is not damaged by the clamp force.

The resin material is poured into space between the dies 14, 15, and then, the resin material is hardened. Thus, the apparatus 1 is completed.

The heat radiation surfaces 9a, 9b, 10a, 10b of the heat radiation members 9, 10 are exposed on the first and second surfaces 3, 4 of the apparatus 1. The semiconductor chips 5, 6 are mounted on the mounting surfaces 9c, 10c perpendicular to the heat radiation surfaces 9a, 9b, 10a, 10b.

When the apparatus 1 is manufactured, the clamp force of the dies 14, 15 is applied to only the heat radiation members 9, 10. Thus; compression force is not applied to the chips 5, 6 via the heat radiation members 9, 10. Further, after the resin mold 11 is formed, the both-side heat radiation structure is obtained. Thus, it is not necessary to remove burr of resin material.

Further, the thickness of the apparatus 1 is determined by only the thickness of each heat radiation member 9, 10. Accordingly, before the semiconductor chips 5, 6 are assembled in the heat radiation members 9, 10, the dimensional control is performed to only adjust the thickness of each heat radiation member 9, 10, the positional relationship of the heat radiation members 9, 10, and the flatness and parallelism of the heat radiation members 9, 10. Thus, the dimensional control is easily performed. It is not necessary to execute a step for controlling the shape tolerance of the apparatus 1 after the resin mold 11 is formed.

Thus, the semiconductor apparatus 1 having the both-side heat radiation structure is formed without a step for removing resin burr of the resin mold 11 and without a step for obtaining high accuracy of the shape tolerance of the apparatus 1. Each heat radiation member 9, 10 has high accuracy of the shape tolerance.

Thus, since it is not necessary to execute the step for removing the resin burr, excess resin material for the resin mold 11 does not exist when the resin mold 11 is formed. Further, it is not necessary to execute a step for adjusting the accuracy of the shape tolerance by cutting the excess resin material. Thus, the manufacturing cost of the apparatus 1 is reduced.

Second Embodiment

Figure 5A:
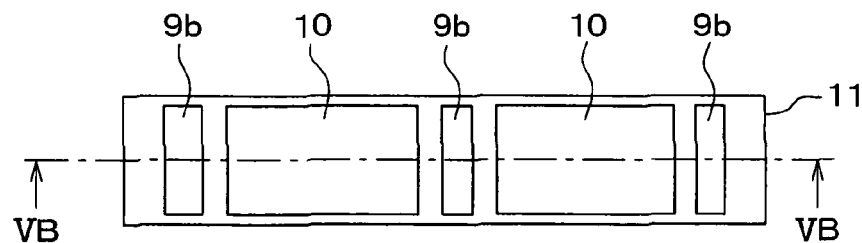
FIG. 5A is a plan view showing a semiconductor apparatus according to a second embodiment.
Figure 5B:
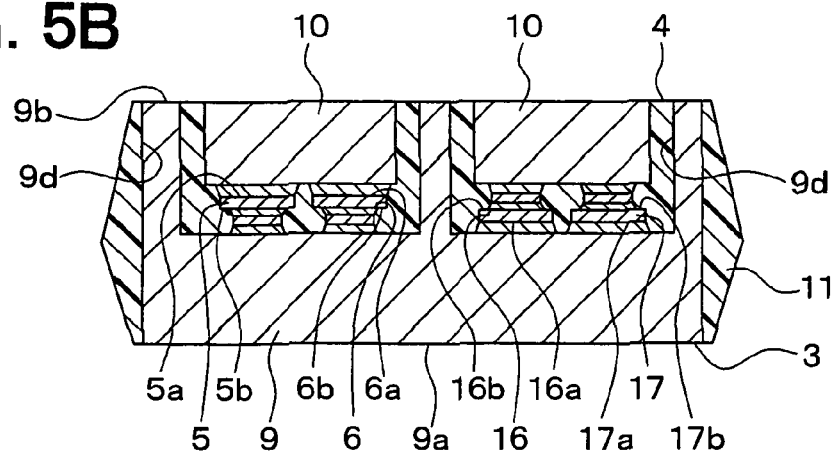
FIG. 5B is a cross sectional view showing the apparatus taken along line VB-VB in FIG. 5A.

FIGS. 5A and 5B show a semiconductor apparatus according to a second embodiment. The first heat radiation member 9 has the first heat radiation surface 9a exposed on the first surface 3 and the second heat radiation surface 9b exposed on the second surface 4. The second heat radiation surface 9b includes tow concavities 9d, which is concaved on the first heat radiation surface side. The semiconductor apparatus 1 includes third and fourth semiconductor chips 16, 17.

The front side 5b of the first semiconductor chip 5 and the front side 6b of the second semiconductor chip 6 are electrically and thermally connected to the bottom of the concavity 9d. The backside 5a of the first semiconductor chip 5 and the backside 6a of the second semiconductor chip 6 are electrically and thermally connected to the second heat radiation member 10, which is disposed in the concavity 9d.

The backside 16a, 17a of each chip 16, 17 is electrically and thermally connected to the bottom of the other concavity 9d. Further, the front side 16b of the chip 16 and the front side 17b of the chip 17 are electrically and thermally connected to the second heat radiation member 10, which is disposed in the concavity 9d.

A part of the second heat radiation member 10 is exposed on the second surface 4. At least one of the first and second heat radiation members 9, 10 is exposed on both of the first and second surfaces 3, 4. Here, the first heat radiation member 9 is exposed on both of the first and second surfaces 3, 4. Thus, it is not necessary to expose the second heat radiation member 10 on both of the first and second surfaces 3, 4.

In the apparatus 1, since the first heat radiation member 9 is exposed on both of the first and second surfaces 3, 4, the first and second dies 14, 15 sandwich the first heat radiation member 9 so that the resin mold 11 is formed. Thus, the dimensional control according to the second embodiment is performed only to control the shape accuracy of the first heat radiation member 9. Accordingly, after the resin mold 11 is formed, the step for removing the resin burr and the step for obtaining the dimensional accuracy of the shape tolerance of the apparatus 1 are not necessary to perform.

In this case, the front and backsides of each chip 5, 6, 16, 17 are parallel to the heat radiation surfaces 9a, 9b of the first heat radiation member 9. Thus, the terminal 2 connecting to the chips 5, 6, 16, 17 is arranged between the dies 14, 15. Thus, it is not necessary to bend the terminal 2 intricately as shown in FIGS. 3A to 3F. The terminal 2 is easily arranged in the apparatus 1.

Further, regarding heat radiation performance, the apparatus 1 is superior to the apparatus according to JP-A-2004-296663. Specifically, each chip 5, 6, 16, 17 is arranged at a center of the apparatus 1 in the thickness direction. Thus, the distance from each chip 5, 6, 16, 17 to the first or second surface 3, 4 is minimized. Thus, the heat radiation path is shortened. The heat generated in the chips 5, 6, 16, 17 is linearly and directly transmitted to the first and second surfaces 3, 4. In the prior art, a relay element functioning as both of a heat radiation member and an electrode is sandwiched in an electric device. The heat is introduced into the relay element from both sides of the apparatus so that heat resistance of the apparatus increases. Further, the heat radiation path of the relay element in the prior art, which corresponds to a distance between the device and the heat radiation surface, is larger than the heat radiation path according to the present embodiment. Thus, the heat radiation performance of the apparatus 1 is improved, compared with the prior art.

Third Embodiment

Figure 6A:
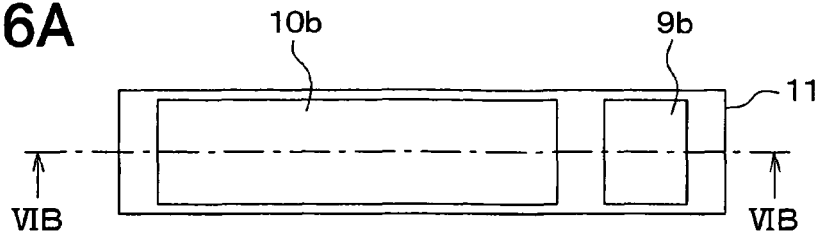
FIG. 6A is a plan view showing a semiconductor apparatus according to a third embodiment.
Figure 6B:
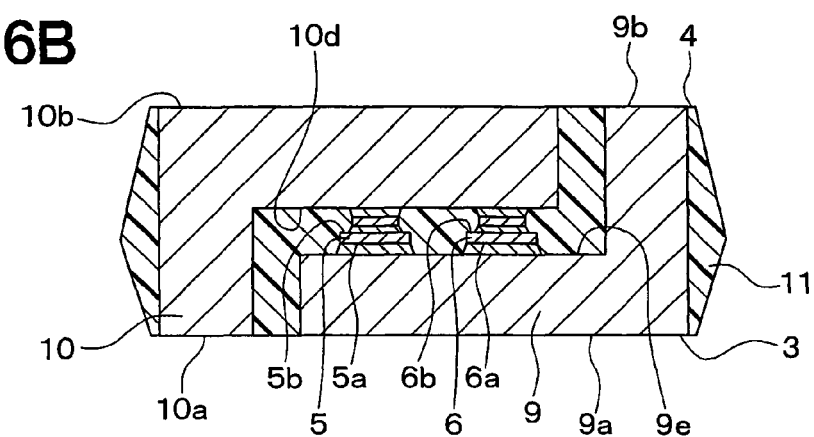
FIG. 6B is a cross sectional view showing the apparatus taken along line VIB-VIB in FIG. 6A.

FIGS. 6A and 6B show a semiconductor apparatus 1 according to a third embodiment. The first heat radiation member 9 includes the first heat radiation surface 9a exposed on the first surface 3 and the second heat radiation surface 9b exposed on the second surface 4. The first heat radiation surface 9a is larger than the second heat radiation surface 9b. The first heat radiation member 9 has a L shape. Similarly, the second heat radiation member 10 includes the third heat radiation surface 10a exposed on the first surface 3 and the fourth heat radiation surface 10b exposed on the second surface 4. The third heat radiation surface 10a is smaller than the fourth heat radiation surface 10b. The second heat radiation member 10 has a L shape.

The backside 5a of the first semiconductor chip 5 and the backside 6a of the second semiconductor chip 6 are electrically and thermally connected to the first mounting surface 9e, which is opposite to the first heat radiation surface 9a of the first heat radiation member 9. The front side 5b of the first semiconductor chip 5 and the front side 6b of the second semiconductor chip 6 are electrically and thermally connected to the second mounting surface 10d, which is opposite to the fourth heat radiation surface 10b of the second heat radiation member 10.

The terminal 2 is arranged at a joint between the first and second dies 14, 15. Each heat radiation member 9, 10 is exposed on both of the first and second surfaces 3, 4 of the apparatus 1. The dimensional control of the apparatus 1 is performed only by controlling the accuracy of the heat radiation members 9, 10.

Fourth Embodiment

Figure 7A:
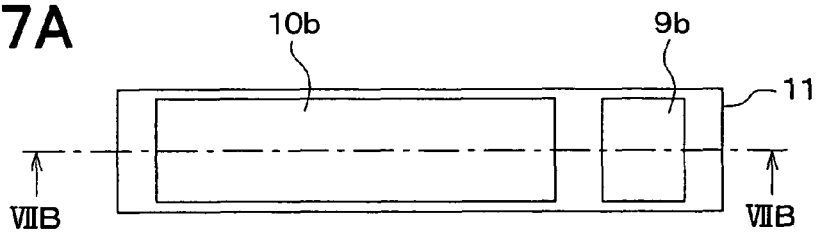
FIG. 7A is a plan view showing a semiconductor apparatus according to a fourth embodiment.
Figure 7B:
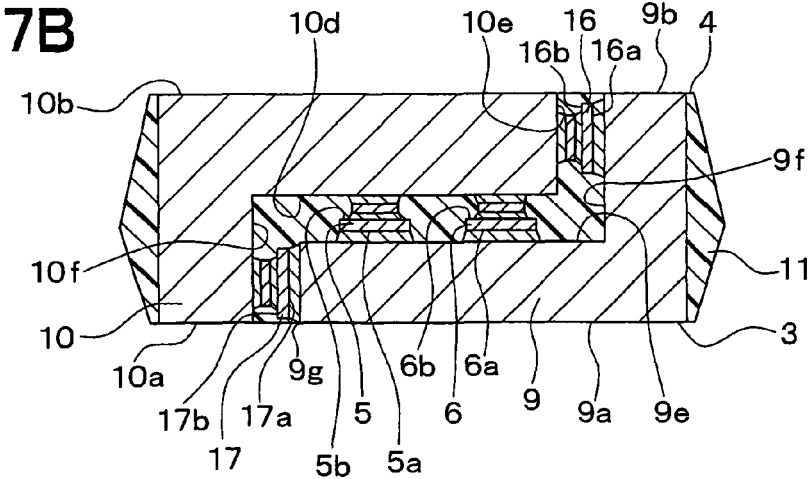
FIG. 7B is a cross sectional view showing the apparatus taken along line VIIB-VIIB in FIG. 7A.

FIGS. 7A and 7B show a semiconductor apparatus 1.

The apparatus 1 includes first to fourth semiconductor chips 5, 6, 16, 17. The backside 16a of the third semiconductor chip 16 is electrically and thermally connected to the third mounting surface 9f, which is perpendicular to the second heat radiation surface 9b of the first heat radiation member 9. The front side 16b of the third semiconductor chip 16 is electrically and thermally connected to the fourth mounting surface 10e of the second heat radiation member 10.

The backside 17a of the fourth semiconductor chip 17 is electrically and thermally connected to the fifth mounting surface 9g, which is perpendicular to the first heat radiation surface 9a of the first heat radiation member 9. The front side 17b of the fourth semiconductor chip 17 is electrically and thermally connected to the sixth mounting surface 10f, which is perpendicular to the third heat radiation surface 10a of the second heat radiation member 10.

In this case, the third and fourth semiconductor chips 16, 17 include a diode or the like, which is not necessary to connect to the terminal 2, and are arranged between the third and fourth mounting surfaces 9f, 10e and/or between the fifth and sixth mounting surfaces 9g, 10f. The first and second semiconductor chips 5, 6 include an IGBT or the like, which is necessary to connect to the terminal 2, and are arranged between the first and second mounting surfaces 9e, 10d, which are parallel to the joint between the first and second dies 14, 15, so that the terminal 2 is easily arranged in the apparatus 1.

The chips 5, 6, 16, 17 are arranged to be separated from each other by a distance between two adjacent chips 5, 6, 16, 17. Thus, the heat is not concentrated at a certain part of the heat radiation members 9, 10. Accordingly, the heat radiation performance of the apparatus 1 is improved.

Fifth Embodiment

Figure 8A:
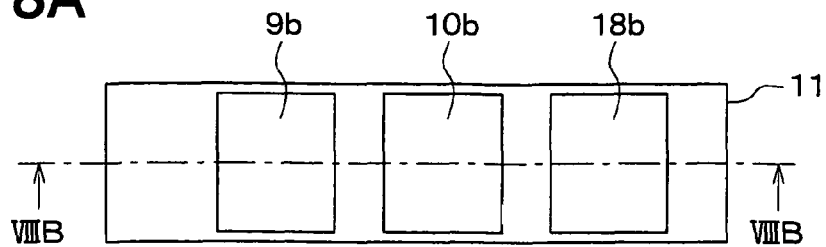
FIG. 8A is a plan view showing a semiconductor apparatus according to a fifth embodiment.
Figure 8B:
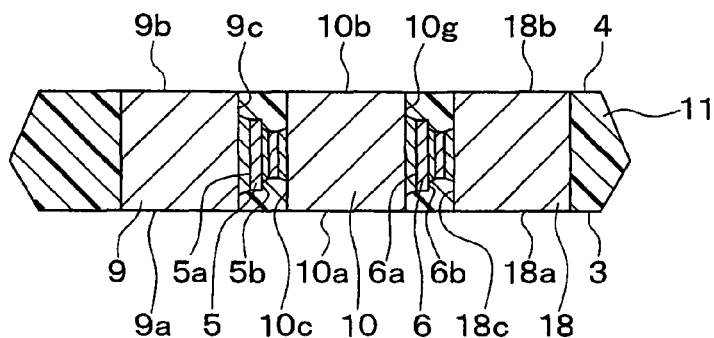
FIG. 8B is a cross sectional view showing the apparatus taken along line VIIIB-VIIIB in FIG. 8A.

FIGS. 8A and 8B show a semiconductor apparatus 1 according to a fifth embodiment. The apparatus 1 includes three heat radiation members 9, 10, 18 and two semiconductor chips 5, 6.

The heat radiation members 9, 10, 18 are arranged on the same line. The first heat radiation surface 9a of the first heat radiation member 9, the third heat radiation surface 10a of the second heat radiation member 10 and the fifth heat radiation surface 18a of the third heat radiation member 18 are exposed on the first surface 3 of the apparatus 1. The second heat radiation surface 9b of the first heat radiation member 9, the fourth heat radiation surface 10b of the second heat radiation member 10 and the sixth heat radiation surface 18b of the third heat radiation member 18 are exposed on the second surface 4 of the apparatus 1.

The backside 5a of the first semiconductor chip 5 is electrically and thermally connected to the first mounting surface 9c, which is perpendicular to the first heat radiation surface 9a of the first heat radiation member 9. The front 5b of the first semiconductor chip 5 is electrically and thermally connected to the second mounting surface 10c, which faces the first mounting surface 9c of the second heat radiation member 10.

The backside 6a of the second semiconductor chip 6 is electrically and thermally connected to the third mounting surface 10g, which is opposite to the second mounting surface 10c of the second heat radiation member 10. The front side 6b of the second semiconductor chip 6 is electrically and thermally connected to the fourth mounting surface 18c, which faces the third mounting surface 10g of the second heat radiation member 10.

Thus, each chip 5, 6 having the same type of semiconductor element are connected in series. Further, the thickness of each heat radiation member 9, 10, 18 is equal to the thickness of the apparatus 1, so that the dimensions of the apparatus 1 is minimized.

Sixth Embodiment

Figure 9A:
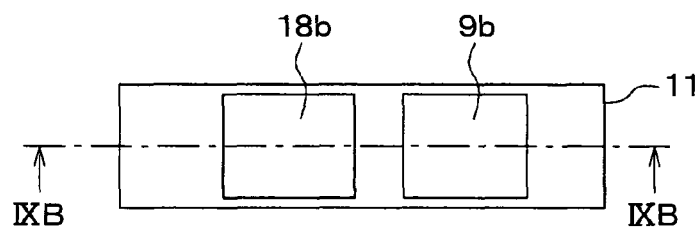
FIG. 9A is a plan view showing a semiconductor apparatus according to a sixth embodiment.
Figure 9B:
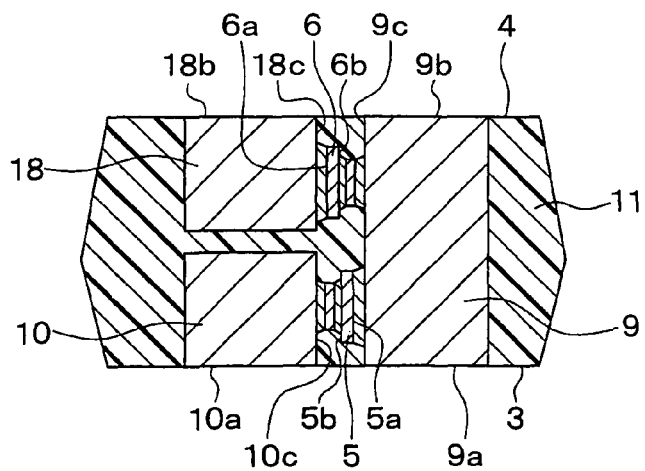
FIG. 9B is a cross sectional view showing the apparatus taken along line IXB-IXB in FIG. 9A.

FIGS. 9A and 9B show a semiconductor apparatus 1 according to a sixth embodiment.

The apparatus 1 includes two semiconductor chips 5, 6 and three heat radiation members 9, 10, 18.

The first heat radiation member 9 includes the first heat radiation surface 9a exposed on the first surface 3 of the apparatus 1, the second heat radiation surface 9b exposed on the second surface 4 of the apparatus 1, and the first mounting surface 9c perpendicular to the first and second heat radiation surfaces 9a, 9b. The second heat radiation member 10 includes the third heat radiation surface 10a exposed on the first surface 3 of the apparatus 1, and the second mounting surface 10c perpendicular to the third heat radiation surface 10a. The third heat radiation member 18 includes the fourth heat radiation surface 18b exposed on the second surface 4 of the apparatus 1, and the third mounting surface 18c perpendicular to the fourth heat radiation surface 18b.

The backside 5a of the first semiconductor chip 5 is electrically and thermally connected to the first mounting surface 9c. The front side 5b of the first semiconductor chip 5 is electrically and thermally connected to the second mounting surface 10c. The backside 6a of the second semiconductor chip 6 is electrically and thermally connected to the third mounting surface 18c. The front side 6b of the second semiconductor chip 6 is electrically and thermally connected to the first mounting surface 9c.

Thus, a current path among the third heat radiation member 18, the second semiconductor chip 6, the first heat radiation member 9, the first semiconductor chip 5 and the second heat radiation member 10 is formed. Thus, the apparatus 1 having multiple semiconductor devices, which are arranged in series, is obtained. The second and third heat radiation members 10, 18 and the first heat radiation member 9 are arranged proximately, so that an inductance of the apparatus 1 is low. Thus, a surge voltage is reduced.

Seventh Embodiment

Figure 10A:
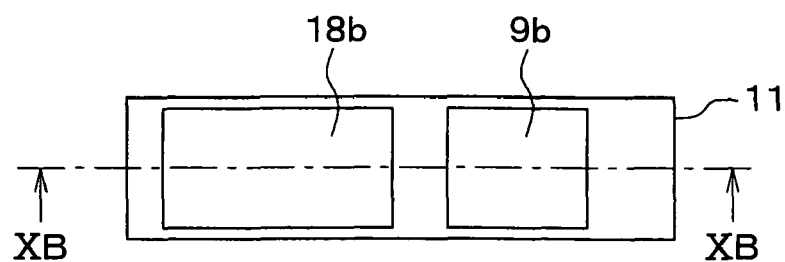
FIG. 10A is a plan view showing a semiconductor apparatus according to a seventh embodiment.
Figure 10B:
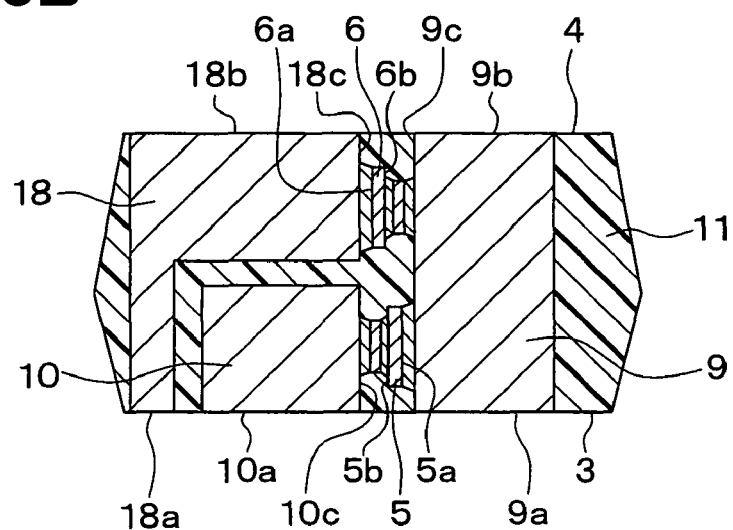
FIG. 10B is a cross sectional view showing the apparatus taken along line XB-XB in FIG. 10A.

FIGS. 10A and 10B show a semiconductor apparatus 1 according to a seventh embodiment.

The third heat radiation member 18 includes a fifth heat radiation surface 18a exposed on the first surface 3 of the apparatus 1. Accordingly, the first and third heat radiation surfaces 9, 18 are exposed on both of the first and second surfaces 3, 4 of the apparatus 1, respectively. The first and third heat radiation members 9, 18 support the clamp force of the dies 14, 15, so that the transmission of the clamp force to the chips 5, 6 is reduced.

Eighth Embodiment

Figure 11A:
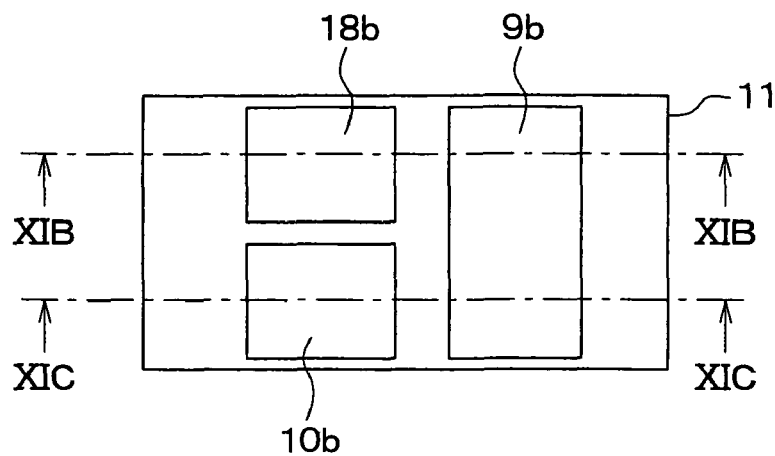
FIG. 11A is a plan view showing a semiconductor apparatus according to an eighth embodiment.
Figure 11B:
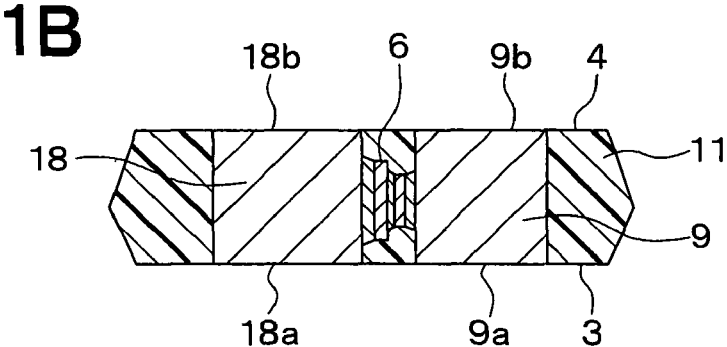
FIG. 11B is a cross sectional view showing the apparatus taken along line XIB-XIB in FIG. 11A.
Figure 11C:
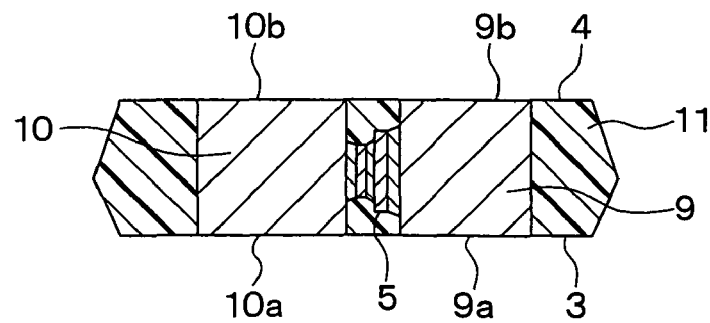
FIG. 11C is a cross sectional view showing the apparatus taken along line XIC-XIC in FIG. 11A.

FIGS. 11A to 11C show a semiconductor apparatus 1 according to an eighth embodiment.

The second heat radiation member 10 includes the sixth heat radiation surface 10b exposed on the second surface 4 of the apparatus 1. A connection manner of the heat radiation members 9, 10, 18 and the semiconductor chips 5, 6 in the eight embodiment is similar to that in the sixth and seventh embodiments.

The first to third heat radiation members 9, 10, 18 are arranged on the same plane. The thickness of the apparatus 1 is defined by the thickness of each heat radiation member 9, 10, 18. Thus, the dimensions of the apparatus 1 are minimized.

Ninth Embodiment

Figure 12A:
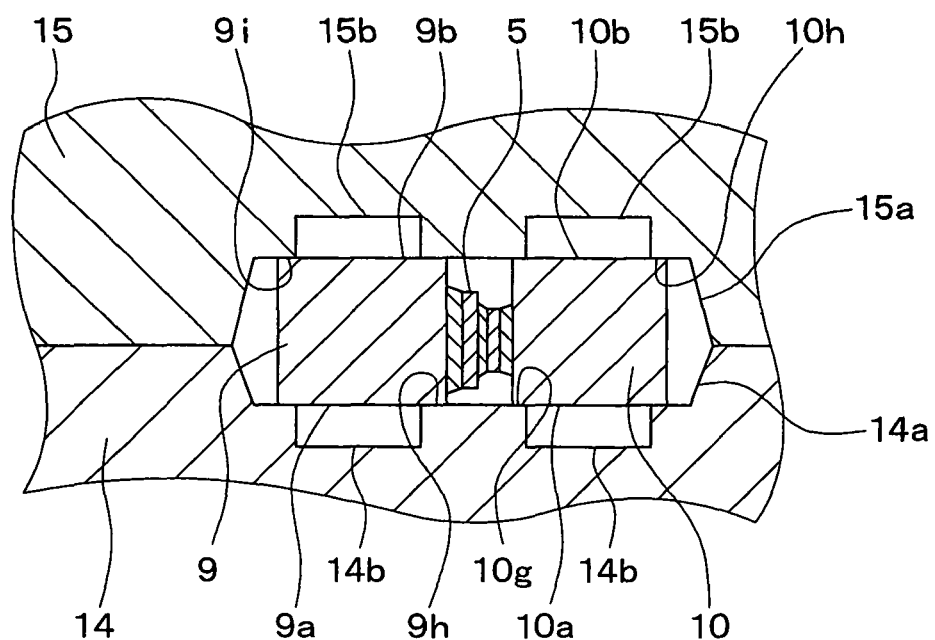
FIG. 12A is a cross sectional view showing a manufacturing method of a semiconductor apparatus according to a ninth embodiment.
Figure 12B:
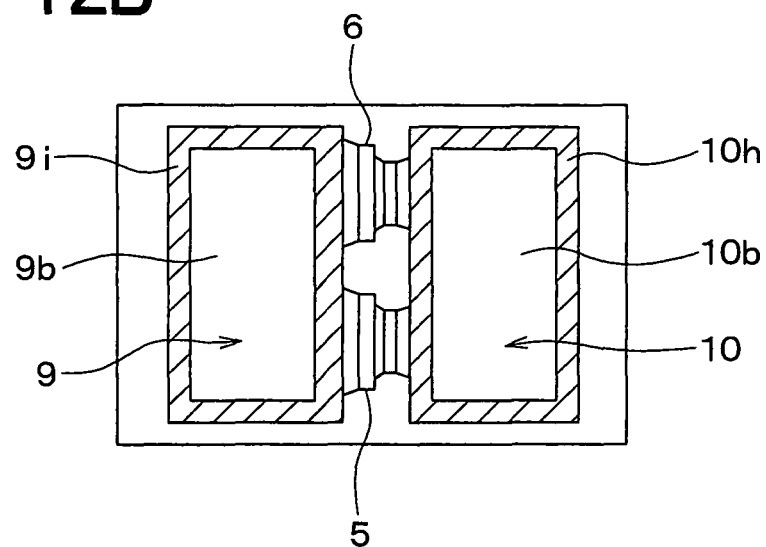
FIG. 12B is a plan view showing a part of a heat radiation member in the apparatus.

FIG. 12A shows a manufacturing method of a semiconductor apparatus 1 according to a ninth embodiment. FIG. 12B is a plan view showing a part of the heat radiation members 9, 10, which is pressed by the second die 15. The part is shown as a hatched area. Here, the apparatus 1 in the ninth embodiment is, for example, the apparatus shown in FIG. 2. The method according to the ninth embodiment will be explained with reference to the apparatus 1 shown in FIG. 2 as an example.

The first die 14 includes another concavity 14b, which is disposed on the bottom of the concavity 14a of the first die 14. The bottom of the concavity 14a contacts the outer periphery 9h, 10g of the heat radiation surface 9a, 10a exposed on the first surface 3 of the apparatus 1. The second die 15 includes another concavity 15b, which is disposed on the bottom of the concavity 15a of the second die 15. The bottom of the concavity 15a contacts the outer periphery 9i, 10h of the heat radiation surface 9b, 10b exposed on the second surface 4 of the apparatus 1.

The outer periphery 9i, 10h of each heat radiation member 9, 10 shown as the hatched area in FIG. 12B contacts the second die 15. The outer periphery 9h, 10g of each heat radiation member 9, 10 contacts the first die 14. Thus, a contact area of each die 14, 15 on the heat radiation members 9, 10 is reduced, so that the load of the die 14, 15 applied to the heat radiation members 9, 10 and the chips 5, 6 is reduced. Further, each die 14, 15 contacts only the outer periphery 9h, 9i, 10g, 10h, not a whole of the heat radiation member 9, 10. Thus, the die 14, 15 absorbs deformation of the heat radiation member 9, 10, which is caused by the clamp force.

Tenth Embodiment

Figure 13:
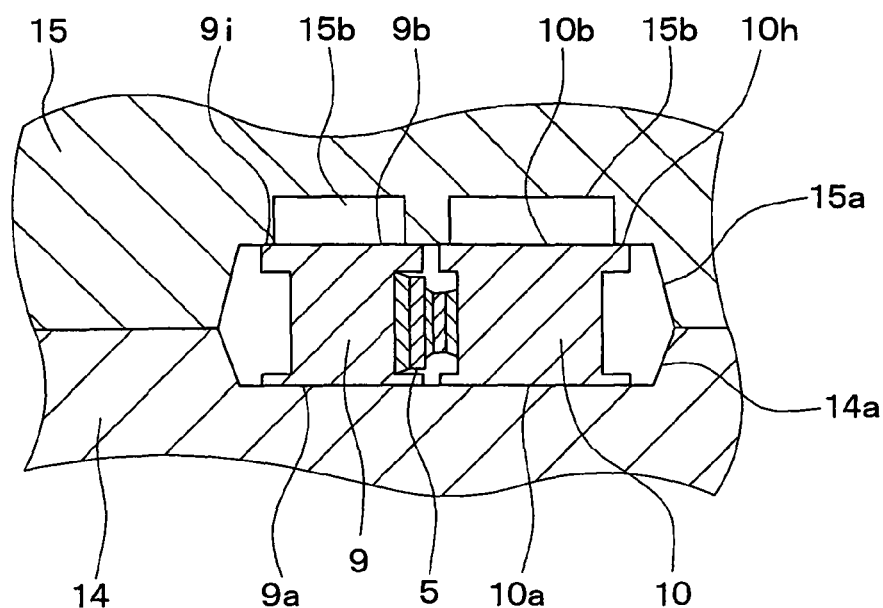
FIG. 13 is a cross sectional view showing a manufacturing method of a semiconductor apparatus according to a tenth embodiment.

FIG. 13 shows a manufacturing method of a semiconductor apparatus 1 according to a tenth embodiment. Here, the apparatus 1 in the tenth embodiment is, for example, the apparatus shown in FIG. 2. The method according to the tenth embodiment will be explained with reference to the apparatus 1 shown in FIG. 2 as an example.

The first die 14 according to the tenth embodiment is shown in FIG. 4. The second die 15 according to the tenth embodiment is shown in FIG. 12.

When the apparatus shown in FIG. 2 is manufactured, the heat radiation surface 9a of the heat radiation member 9 exposed on the first surface 3 of the apparatus 1, the heat radiation surface 10a of the heat radiation member 10 exposed on the first surface 3 of the apparatus 1, the heat radiation surface 9b of the heat radiation member 9 exposed on the second surface 4 of the apparatus 1, and the heat radiation surface 10b of the heat radiation member 10 exposed on the second surface 4 of the apparatus 1 are larger than a cross sectional area of a center portion of each heat radiation member 9, 10, the cross sectional area being parallel to the first and second surfaces 3, 4.

As shown in FIG. 13, the cross section of each heat radiation member 9, 10, which is perpendicular to the bottom of the die 14, 15, has a H shape. Specifically, the outer periphery 9i, 10h of each heat radiation surface 9b, 10b protrudes from the center portion of the heat radiation member 9, 10.

Accordingly, the heat radiation surface 9b, 10b protruded from a body of the heat radiation member 9, 10 contacts the bottom of the second die 15. Accordingly, the clamp force to be applied to the heat radiation members 9, 10 is much reduced, compared with a case shown in FIG. 12. Thus, the load to be applied to the heat radiation members 9, 10 and the semiconductor chips 5, 6 is much reduced.

In FIG. 13, although only the second die 15 includes the concavity 15b, the first die 14 may include the concavity 14b.

Eleventh Embodiment

Figure 14:
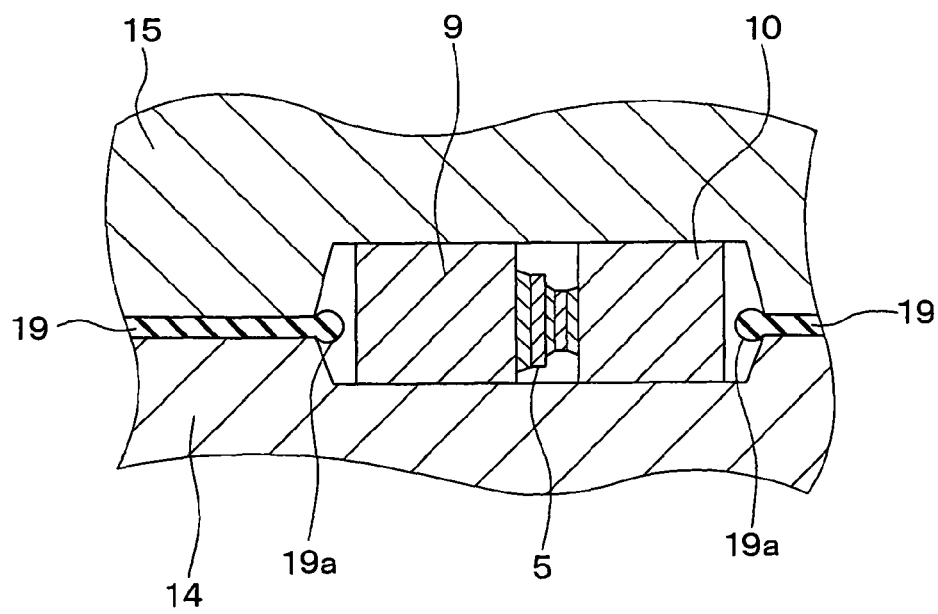
FIG. 14 is a cross sectional view showing a manufacturing method of a semiconductor apparatus according to an eleventh embodiment.

FIG. 14 shows a manufacturing method of a semiconductor apparatus according to a eleventh embodiment. The method according to the eleventh embodiment will be explained with reference to the apparatus 1 shown in FIG. 2 as an example.

After the chips 5, 6 are mounted on the heat radiation members 9, 10, an elastic sheet 19 is arranged between the dies 14, 15 when the assembly is mounted in the dies 14, 15. Thus, the elastic sheet 19 is sandwiched between the first and second dies 14, 15. Further, the heat radiation surfaces 9a, 10a exposed on the first surface 3 and the heat radiation surfaces 9b, 10b exposed on the second surface 4 are sandwiched between the dies 14, 15.

The elastic sheet 19 is elastically deformed by sandwiching with the dies 14, 15. In this case, one end 19a of the sheet 19 protrudes into the concavities 14a, 15a of the dies 14, 15. After the resin mold 11 is formed, the one end 19a of the sheet 19, which is embedded in the resin mold 11, is removed. Thus, the apparatus 1 is completed.

By absorbing the clamp force of the dies 14, 15 with the elastic sheet 19 between the dies 14, 15, the load to be applied to the heat radiation members 9, 10 and the chips 5, 6 is reduced.

Twelfth Embodiment

Figure 15:
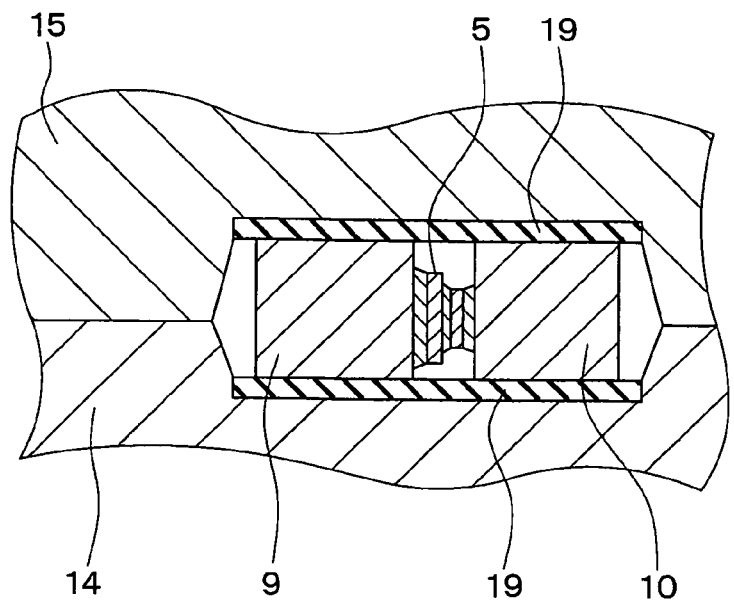
FIG. 15 is a cross sectional view showing a manufacturing -method of a semiconductor apparatus according to a twelfth embodiment.

FIG. 15 shows a manufacturing method of a semiconductor apparatus according to a twelfth embodiment. The elastic sheet 19 is arranged between the bottom of the concavity 14a of the first die 14 and the heat radiation surfaces 9a, 10a exposed on the first surface 3. Further, another elastic sheet 19 is arranged between the bottom of the concavity 15a of the second die 15 and the heat radiation surfaces 9b, 10b exposed on the second surface 4.

Thus, the heat radiation members 9, 10 are sandwiched between the elastic sheets 19. Under this condition, the dies 14, 15 clamp the heat radiation members 9, 10, and the resin mold 11 is formed.

The heat radiation members 9, 10 are directly sandwiched between the elastic sheets 19, so that the clamp force is absorbed with the sheets 19. Thus, the load to be applied to the heat radiation members 9, 10 and the chips 5, 6 is reduced.

Other Embodiments

The above embodiments may be combined with each other.

In the first embodiment, the apparatus 1 includes two semiconductor chips 5, 6. Alternatively, the apparatus 1 may include only one semiconductor chip or more than two semiconductor chips.

In the second embodiment, the first heat radiation member 9 includes two concavities 9d. Alternatively, the first heat radiation member 9 may include only one concavity or more than two concavities. Further, although the backside 5a of the first semiconductor chip 5 contacts the second heat radiation member 10, the front side 5b of the first semiconductor chip 5 may contact the second heat radiation member 10.

In the ninth embodiment, each die 14, 15 includes the second concavity 14b, 15b, which is concaved on the bottom of the first concavity 14a, 15a. Alternatively, only one of the die 14, 15 may include the second concavity 14b, 15b.

In the ninth to twelfth embodiments, the methods according to the ninth to twelfth embodiments are explained with reference to the apparatus 1 shown in FIG. 2 as an example. Alternatively, the methods according to the ninth to twelfth embodiments may be explained with reference to the apparatus 1 shown in FIGS. 5-11 as an example.

Figure 16:
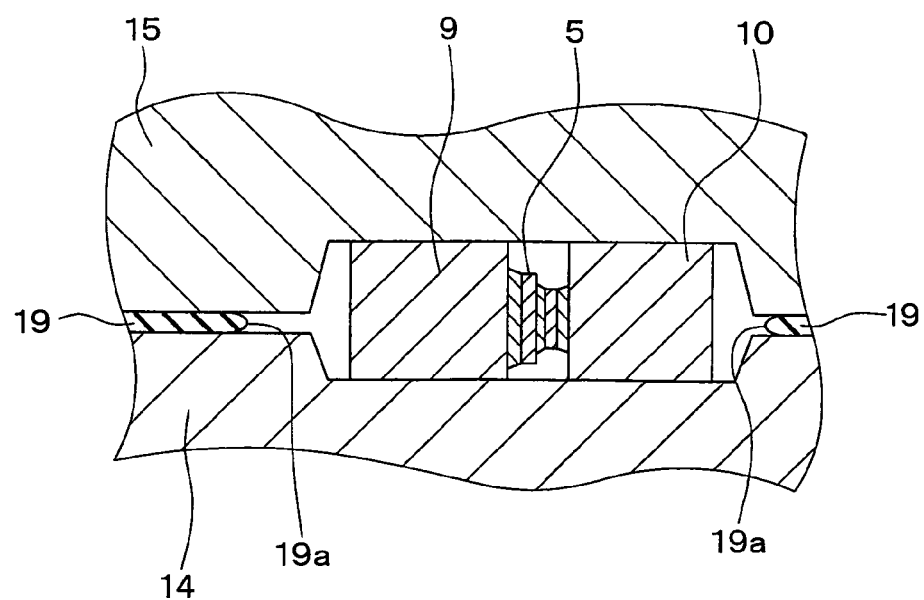
FIG. 16 is a cross sectional view showing a manufacturing method of a semiconductor apparatus according to other embodiments.

In the eleventh embodiment, the end 19*a* of the sheet 19 is embedded in the resin mold 11. Alternatively, as shown in FIG. 16, the end 19*a* of the sheet 19 may not protrude into the concavities 14*a*, 15*a* of the dies 14, 15. In this case, the end 19*a* of the sheet 19 is not embedded in the resin mold 11.

Figure 17A:
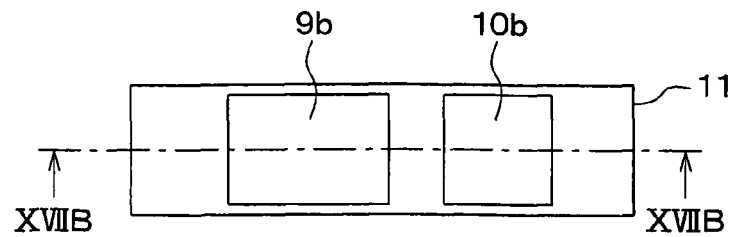
FIG. 17A is a plan view showing a semiconductor apparatus according to other embodiments.
Figure 17B:
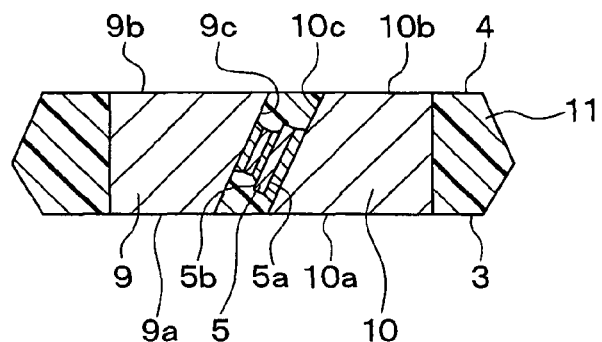
FIG. 17B is a cross sectional view showing the apparatus taken along line XVIIB-XVIIB in FIG. 17A.

In the above embodiments, the heat radiation surface is perpendicular to the mounting surface, or the heat radiation surface and the mounting surface are parallel to each other. Alternatively, the mounting surface may slant with respect to the heat radiation surface. FIGS. 17A and 17B show a semiconductor apparatus 1, in which the mounting surface slants with respect to the heat radiation surface. The first heat radiation member 9 includes the first mounting surface 9*c*, which is tilted at a predetermined angle with respect to the first and second heat radiation surfaces 9*a*, 9*b*. The second heat radiation member 10 includes the second mounting surface 10*c*, which is tilted at a predetermined angle with respect to the third and fourth heat radiation surfaces 10*a*, 10*b*.

The backside 5*a* of the first semiconductor chip 5 is electrically and thermally connected to the first mounting surface 9*c* of the first heat radiation member 9. The front side 5*b* of the first semiconductor chip 5 is electrically and thermally connected to the second mounting surface 10*c* of the second heat radiation member 10. Thus, even when each mounting surface 9*c*, 10*c* slants with respect to the heat radiation surfaces 9*a*, 9*b*, 10*a*, 10*b*, the apparatus 1 has the both-side heat radiation structure.

Figure 18:
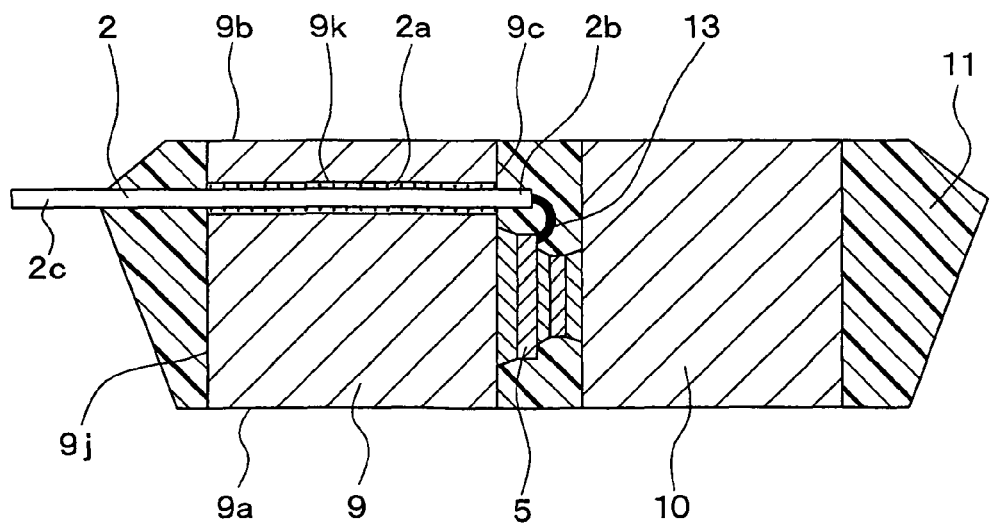
FIG. 18 is a cross sectional view showing a semiconductor apparatus according to other embodiments.

In the apparatus 1 shown in FIGS. 2 and 8, the heat radiation surface is perpendicular to the mounting surface. Accordingly, it is complicated to mount the terminal 2. As shown in FIG. 18, the first heat radiation member 9 includes a through hole 9*k*, which penetrates from the mounting surface 9*c* to a side surface 9*j* opposite to the mounting surface 9*c*. The terminal 2 is inserted into the through hole 9*k*. An insulation layer 2*a* is arranged on the sidewall of the terminal 2, which is disposed in the through hole 9*k*, so that the first heat radiation member 9 is isolated from the terminal 2 with the insulation layer 2*a*. One end 2*b* of the terminal 2 is electrically connected to the first semiconductor chip 5 with a wire 13. Further, the other end 2*c* of the terminal 2 is exposed from the resin mold 11 so that the other end 2*c* is electrically coupled with an external circuit. Thus, it is not necessary to bend the terminal 2 in a complex manner so as to arrange the terminal 2 at the joint between the dies 14, 15.

Figure 19:
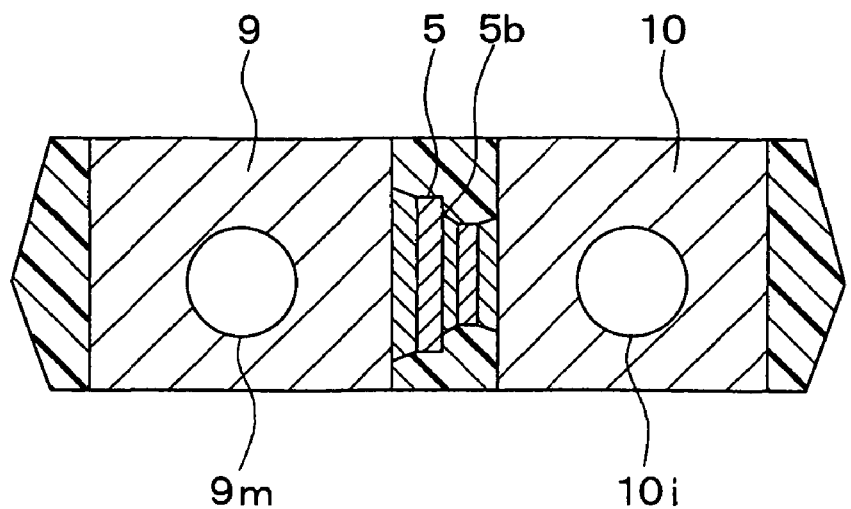
FIG. 19 is a cross sectional view showing a semiconductor apparatus according to other embodiments.

As shown in FIG. 19, each heat radiation member 9, 10 includes a through hole 9*m*, 10*i*, which is parallel to the front side 5*b* of the first semiconductor chip 5. Cooling medium such as air, oil and cooling water may flow through each through hole 9*m*, 10*i* so that the cooling performance of the apparatus 1 is improved.

Figure 20:
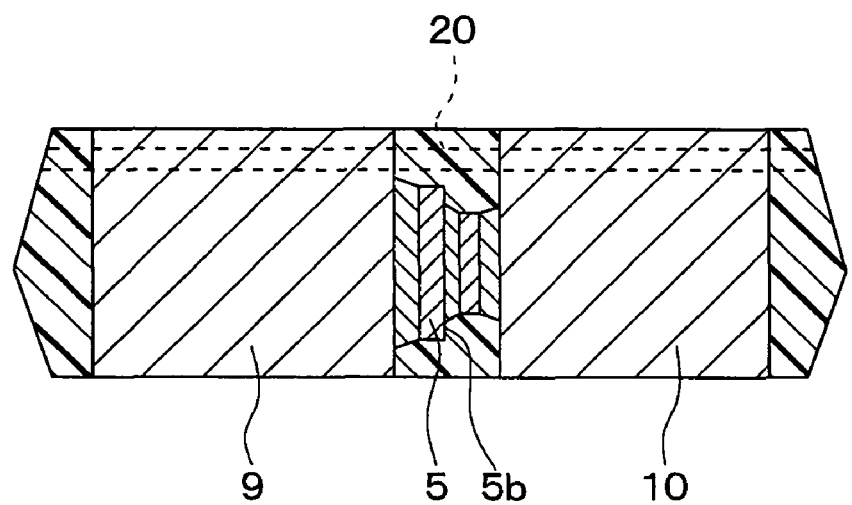
FIG. 20 is a cross sectional view showing a semiconductor apparatus according to other embodiments.

As shown in FIG. 20, the apparatus 1 may include an insulation pipe 20, which penetrates the first and second heat radiation members 9, 10. The insulation pipe 20 extends along with a direction perpendicular to the front side 5*b* of the chip 5. The cooling medium flows through the insulation pipe 20.

Figure 21:
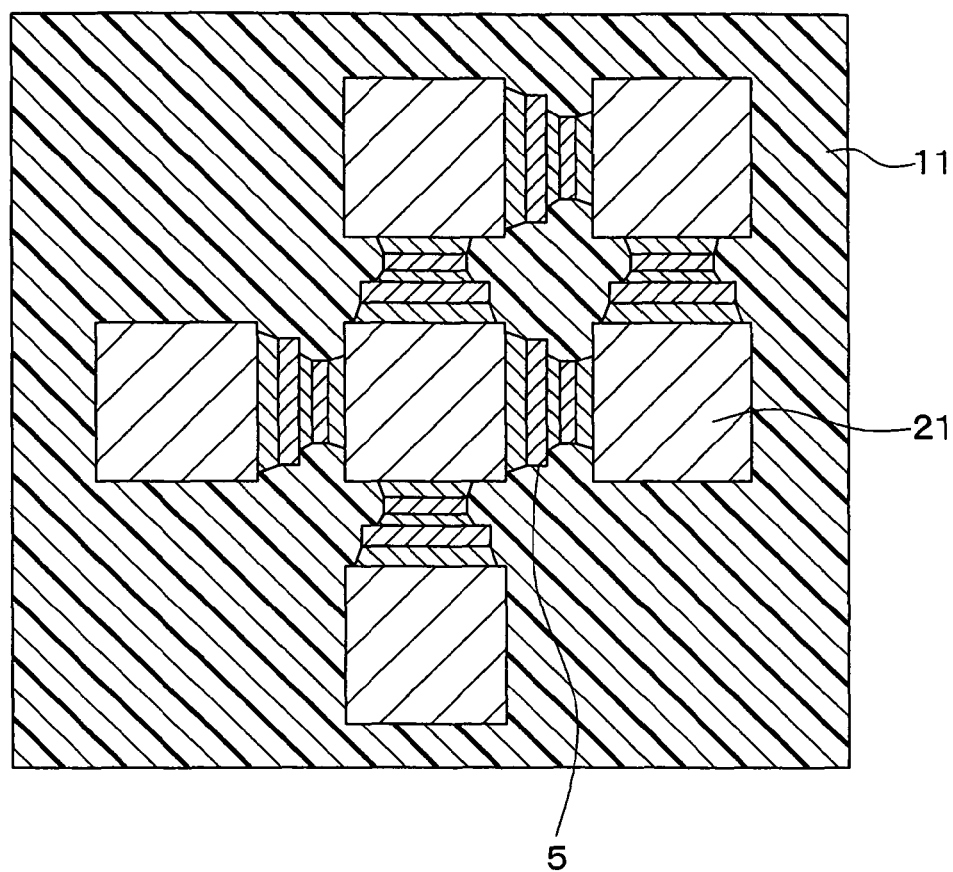
FIG. 21 is a cross sectional view showing a semiconductor apparatus according to other embodiments.

FIG. 21 is a cross sectional view showing a semiconductor apparatus 1 taken along a plane in parallel to the first and second surfaces 3, 4 of the apparatus 1. The apparatus 1 includes multiple heat radiation members. 21 having a block shape. The chip 5 is electrically and thermally connected between the heat radiation members 21. The apparatus shown in FIG. 21 is manufactured such that the apparatus 1 in FIG. 8 expands along with a direction perpendicular to the first surface 3. The heat radiation members 21 are aligned along with two directions, one of which is perpendicular to the first surface 3, and the other one of which is parallel to the first surface 3.

The above disclosure has the following aspects.

According to a first aspect of the present disclosure, a semiconductor apparatus having a first surface and a second surface opposite to the first surface, includes: a semiconductor chip having a front side and a backside; a first heat radiation member electrically and thermally coupled with the backside of the chip; a second heat radiation member electrically and thermally coupled with the front side of the chip; and a resin mold sealing the first and second heat radiation members together with the chip. At least one of the first and second heat radiation members is exposed on both of the first and second surfaces.

When the above apparatus is manufactured, at least one of the first and second heat radiation members is clamped with dies in such a manner that clamp force is only applied to the at least one of the first and second heat radiation members. Accordingly, the clamp force is not directly applied to the semiconductor chip, so that the chip is not damaged by the clamp force. Further, since the at least one of the first and second heat radiation members is exposed on both of the first and second surfaces so that the apparatus has a both-side heat radiation structure, it is not necessary to remove a resin burr when the apparatus is manufactured. Thus, dimensional control of the apparatus is determined by only assembling control of the semiconductor chip in the heat radiation members. The apparatus has high accuracy of shape tolerance in the heat radiation members.

Alternatively, the first heat radiation member may include a first heat radiation surface exposed on the first surface and a second heat radiation surface exposed on the second surface. The first heat radiation member further includes a concavity, which is disposed on the first heat radiation surface, and the backside of the chip is electrically and thermally coupled with a bottom of the concavity. In this case, the clamp force in the manufacturing process is supported by the first and second heat radiation surfaces. Thus, the clamp force applied to the chip via the second heat radiation member is reduced. Further, only the first heat radiation member is exposed on both of the first and second surfaces. Since the chip is arranged in the concavity, a terminal for the chip can be arranged at a joint surface between the first and second dies. Furthermore, the first heat radiation surface of the first heat radiation member is parallel to the backside of the chip, and a heat radiation surface of the second heat radiation member is parallel to the front side of the chip. Accordingly, heat generated in the chip is discharged from the first and second surfaces along with a linear heat radiation path, so that the heat radiation path is minimized. Thus, the heat radiation performance of the apparatus is improved.

Alternatively, the first heat radiation member may include a first heat radiation surface exposed on the first surface and a second heat radiation surface exposed on the second surface. The first heat radiation surface is larger than the second heat radiation surface, and the first heat radiation member has a L shape. The second heat radiation member may include a third heat radiation surface exposed on the first surface and a fourth heat radiation surface exposed on the second surface. The fourth heat radiation surface is larger than the third heat radiation surface, and the second heat radiation member has a L shape. The first heat radiation member further includes a first mounting surface, which is opposite to the first heat radiation surface. The second heat radiation member further includes a second mounting surface, which is opposite to the fourth heat radiation surface, and the backside of the chip is electrically and thermally coupled with the first mounting surface, and the front side of the chip is electrically and thermally coupled with the second mounting surface. In this case, both of the first and second heat radiation members are exposed on both of the first and second surfaces.

Alternatively, the apparatus may further include: a second semiconductor chip having a front side and a backside. The first heat radiation member further includes a third mounting surface, which slants with respect to the second heat radiation surface, and a fifth mounting surface, which slants with respect to the first heat radiation surface. The second heat radiation member further includes a fourth mounting surface, which slants with respect to the fourth heat radiation surface, and a sixth mounting surface, which slants with respect to the third heat radiation surface, and the second semiconductor chip is electrically and thermally coupled between the third and fourth mounting surfaces or between the fifth and sixth mounting surfaces. In this case, multiple chips are arranged between the first and second heat radiation members with a clearance therebetween. Thus, heat is not concentrated at a specific heat radiation member, so that the heat radiation performance of the apparatus is improved.

Further, the third mounting surface may be perpendicular to the second heat radiation surface, and the fifth mounting surface is perpendicular to the first heat radiation surface, and the fourth mounting surface may be perpendicular to the fourth heat radiation surface, and the sixth mounting surface is perpendicular to the third heat radiation surface.

Alternatively, the first heat radiation member may include a first heat radiation surface exposed on the first surface, a second heat radiation surface exposed on the second surface, and a first mounting surface slanting with respect to the first and second heat radiation surfaces, and the second heat radiation member may include a third heat radiation surface exposed on the first surface, a fourth heat radiation surface exposed on the second surface, and a second mounting surface slanting with respect to the third and fourth heat radiation surfaces. The backside of the chip is electrically and thermally coupled with the first mounting surface, and the front side of the chip is electrically and thermally coupled with the second mounting surface. Thus, even when the first and second mounting surfaces slant with respect to the first and second surfaces, the apparatus has a both-side heat radiation structure.

Further, the first mounting surface may be perpendicular to the first and second heat radiation surfaces, and the second mounting surface may be perpendicular to the third and fourth heat radiation surfaces. In this case, the heat radiation member ,ay have a rectangular shape or a cubic shape, so that the dimensional control of the shape tolerance of the heat radiation member is easily performed.

Alternatively, the apparatus may further include: a second semiconductor chip having a front side and a backside; and a third heat radiation member. The second heat radiation member further includes a third mounting surface, which is opposite to the second mounting surface. The third heat radiation member includes a fifth heat radiation surface exposed on the first surface, a sixth heat radiation surface exposed on the second surface, and a fourth mounting surface slanting with respect to the fifth and sixth heat radiation surfaces. The first to third heat radiation members are arranged in a line. The backside of the semiconductor chip is electrically and thermally coupled with the first mounting surface, and the front side of the semiconductor chip is electrically and thermally coupled with the second mounting surface, and the backside of the second semiconductor chip is electrically and thermally coupled with the third mounting surface, and the front side of the second semiconductor chip is electrically and thermally coupled with the fourth mounting surface. In this case, the thickness of the apparatus is determined by the thickness of each heat radiation member. Thus, the thickness of the apparatus is minimized, so that the dimensions of the apparatus are reduced.

Further, the fourth mounting surface may be perpendicular to the fifth and sixth heat radiation surfaces.

Alternatively, the apparatus may further include: a second semiconductor chip having a front side and a backside; and a third heat radiation member. The first heat radiation member includes a first heat radiation surface exposed on the first surface, a second heat radiation surface exposed on the second surface, and a first mounting surface slanting with respect to the first and second heat radiation surfaces. The second heat radiation member includes a third heat radiation surface exposed on the first surface, and a second mounting surface slanting with respect to the third heat radiation surface. The third heat radiation member includes a fourth heat radiation surface exposed on the second surface, and a third mounting surface slanting with respect to the fourth heat radiation surface. The backside of the semiconductor chip is electrically and thermally coupled with the first mounting surface, and the front side of the semiconductor chip is electrically and thermally coupled with the second mounting surface, and the backside of the second semiconductor chip is electrically and thermally coupled with the third mounting surface, and the front side of the second semiconductor chip is electrically and thermally coupled with the first mounting surface. In this case, two chips are capable of connecting in series with each other. Further, the first to third heat radiation members are proximately arranged. Thus, the apparatus has low inductance, so that a surge voltage of the apparatus is reduced.

Further, the third heat radiation member may further include a fifth heat radiation surface exposed on the first surface. The third heat radiation member is capable of supporting the clamp force in the manufacturing process. The clamp force applied to the chip is reduced.

Further, the second heat radiation member may further include a sixth heat radiation surface exposed on the second surface. In this case, the thickness of the apparatus is determined by the thickness of each heat radiation member. Thus, the dimensions of the apparatus are minimized.

Alternatively, the first mounting surface may be perpendicular to the first and second heat radiation surfaces, the second mounting surface may be perpendicular to the third heat radiation surface, and the third mounting surface may be perpendicular to the fourth heat radiation surface. Thus, the control of shape tolerance of the apparatus is easily performed.

Alternatively, the apparatus may further include: a terminal coupling between an external circuit and the semiconductor chip. Each of the first and second heat radiation members is exposed on both of the first and second surfaces. The first heat radiation member includes a first mounting surface, on which the chip is mounted, and an opposite surface of the first mounting surface. The first heat radiation member further includes a through hole, which penetrates from the first mounting surface to the opposite surface. The terminal includes a first end and a second end, and an insulation layer. A part of the terminal is arranged in the through hole via the insulation layer, which is disposed on a sidewall of the part of the terminal. The first end is electrically coupled with the semiconductor chip, and the second end is exposed from the resin mold, and electrically coupled with an external circuit. In this case, a terminal for the chips is easily arranged at the joint surface between the first and second dies. Thus, it is not necessary to bend the terminal in a complex manner.

According to a second aspect of the present disclosure, a method for manufacturing a semiconductor apparatus having a first surface and a second surface opposite to the first surface, the method includes: electrically and thermally coupling a first heat radiation member and a backside of a semiconductor chip; electrically and thermally coupling a second heat radiation member and a front side of the chip; sandwiching the first and second heat radiation members between a first die and a second die, wherein the sandwiching includes mounting the first and second heat radiation members in a first concavity of the first die in such a manner that a first heat radiation surface of the first heat radiation member and a third heat radiation surface of the second heat radiation member contact a bottom of the first concavity of the first die, and mounting the first and second heat radiation members in the second concavity of a second die in such a manner that a second heat radiation surface of the first heat radiation member and a fourth heat radiation surface of the second heat radiation member contact a bottom of the second concavity of the first die; and pouring resin material into the first concavity of the first die and the second concavity of the second die so that the first and second heat radiation members and the chip are sealed with a resin mold in such a manner that at least one of the first and second heat radiation members is exposed on both of the first and second surfaces. The first heat radiation surface of the first heat radiation member is exposed on the first surface and the second heat radiation surface of the first heat radiation member is exposed on the second surface, or the third heat radiation surface of the second heat radiation member is exposed on the first surface and the fourth heat radiation surface of the second heat radiation member is exposed on the second surface. In this method, it is not necessary to remove resin burr. Further, dimensional control of the apparatus is determined by only dimensional control of shape tolerance of the heat radiation member. Thus, the apparatus has high accuracy of shape tolerance in the heat radiation members.

Further, the first die further includes a third concavity, which is disposed on the bottom of the first concavity, or the second die further includes a fourth concavity, which is disposed on the bottom of the second concavity. The mounting the first and second heat radiation members in the first concavity of the first die is performed in such a manner that an outer periphery of each of the first and third heat radiation surfaces contacts an edge of the third concavity, or the mounting the first and second heat radiation members in the second concavity of the second die is performed in such a manner that an outer periphery of each of the second and fourth heat radiation surfaces contacts an edge of the fourth concavity. In this case, a contact area between the heat radiation member and the dies is reduced, so that load applied to the heat radiation member with the die is reduced. Since the die contacts the outer periphery of the heat radiation member, deformation of the heat radiation member caused by the clamp force is reduced.

Alternatively, the first and second heat radiation surfaces of the first heat radiation member may be larger than a cross sectional area of a center portion of the first heat radiation member, the cross sectional area being parallel to the first and second surfaces, or the third and fourth heat radiation surfaces of the second heat radiation member may be larger than a cross sectional area of a center portion of the second heat radiation member, the cross sectional area being parallel to the first and second surfaces. In this case, the clamp force is not applied to the center portion of the heat radiation member. Thus, the load to the heat radiation member is reduced.

Further, the front side or the backside of the semiconductor chip may be parallel to a joint surface between the first and second dies. When a terminal for connecting to an external circuit is formed in the apparatus, the terminal can be arranged at the joint surface between the first and second dies.

Alternatively, the sandwiching may further include: arranging an elastic sheet between the first and second dies so that the elastic sheet is sandwiched between the first and second dies; and sandwiching the first and second heat radiation surfaces of the first heat radiation member and the third and fourth heat radiation surfaces of the second heat radiation member with the first and second dies. In this case, the clamp force is absorbed by the elastic sheet, so that the load applied to the heat radiation member and the chip is reduced.

Alternatively, the sandwiching may further include: arranging a first elastic sheet between the bottom of the first die and the first and second first heat radiation members; and arranging a second elastic sheet between the bottom of the second die and the first and second first heat radiation members. In this case, the clamp force is absorbed by the elastic sheet, so that the load applied to the heat radiation member and the chip is reduced.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor apparatus having a first surface and a second surface opposite to the first surface, the apparatus comprising:
    a semiconductor chip having a front side and a backside;
    a first heat radiation member electrically and thermally coupled with the backside of the chip;
    a second heat radiation member electrically and thermally coupled with the front side of the chip; and
    a resin mold sealing the first and second heat radiation members together with the chip,
    wherein at least one of the first and second heat radiation members has a first heat radiation surface exposed on the first surface and a second heat radiation surface exposed on the second surface,
    wherein the second surface is an upper-most principal surface of the apparatus,
    wherein the first surface is a lower-most principal surface of the apparatus, and
    wherein the first heat radiation surface is arranged on a same plane as the first surface, and the second heat radiation surface is arranged on a same plane as the second surface.

2. The apparatus according to claim 1,
    wherein the first heat radiation member includes a first heat radiation surface exposed on the first surface and a second heat radiation surface exposed on the second surface,
    wherein the first heat radiation member further includes a concavity, which is disposed on the first heat radiation surface, and
    wherein the backside of the chip is electrically and thermally coupled with a bottom of the concavity.

3. The apparatus according to claim 1,
wherein the first heat radiation member includes a first heat radiation surface exposed on the first surface and a second heat radiation surface exposed on the second surface,
wherein the first heat radiation surface is larger than the second heat radiation surface,
wherein the first heat radiation member has a L shape,
wherein the second heat radiation member includes a third heat radiation surface exposed on the first surface and a fourth heat radiation surface exposed on the second surface,
wherein the fourth heat radiation surface is larger than the third heat radiation surface,
wherein the second heat radiation member has a L shape,
wherein the first heat radiation member further includes a first mounting surface, which is opposite to the first heat radiation surface,
wherein the second heat radiation member further includes a second mounting surface, which is opposite to the fourth heat radiation surface, and
wherein the backside of the chip is electrically and thermally coupled with the first mounting surface, and the front side of the chip is electrically and thermally coupled with the second mounting surface.

4. The apparatus according to claim 3, further comprising:
a second semiconductor chip having a front side and a backside,
wherein the first heat radiation member further includes a third mounting surface, which slants with respect to the second heat radiation surface, and a fifth mounting surface, which slants with respect to the first heat radiation surface,
wherein the second heat radiation member further includes a fourth mounting surface, which slants with respect to the fourth heat radiation surface, and a sixth mounting surface, which slants with respect to the third heat radiation surface, and
wherein the second semiconductor chip is electrically and thermally coupled between the third and fourth mounting surfaces or between the fifth and sixth mounting surfaces.

5. The apparatus according to claim 4,
wherein the third mounting surface is perpendicular to the second heat radiation surface, and the fifth mounting surface is perpendicular to the first heat radiation surface, and
wherein the fourth mounting surface is perpendicular to the fourth heat radiation surface, and the sixth mounting surface is perpendicular to the third heat radiation surface.

6. The apparatus according to claim 1,
wherein the first heat radiation member includes a first heat radiation surface exposed on the first surface, a second heat radiation surface exposed on the second surface, and a first mounting surface slanting with respect to the first and second heat radiation surfaces,
wherein the second heat radiation member includes a third heat radiation surface exposed on the first surface, a fourth heat radiation surface exposed on the second surface, and a second mounting surface slanting with respect to the third and fourth heat radiation surfaces, and
wherein the backside of the chip is electrically and thermally coupled with the first mounting surface, and the front side of the chip is electrically and thermally coupled with the second mounting surface.

7. The apparatus according to claim 6,
wherein the first mounting surface is perpendicular to the first and second heat radiation surfaces, and the second mounting surface is perpendicular to the third and fourth heat radiation surfaces.

8. The apparatus according to claim 6, further comprising:
a second semiconductor chip having a front side and a backside; and
a third heat radiation member,
wherein the second heat radiation member further includes a third mounting surface, which is opposite to the second mounting surface,
wherein the third heat radiation member includes a fifth heat radiation surface exposed on the first surface, a sixth heat radiation surface exposed on the second surface, and a fourth mounting surface slanting with respect to the fifth and sixth heat radiation surfaces,
wherein the first to third heat radiation members are arranged in a line,
wherein the backside of the semiconductor chip is electrically and thermally coupled with the first mounting surface, and the front side of the semiconductor chip is electrically and thermally coupled with the second mounting surface, and
wherein the backside of the second semiconductor chip is electrically and thermally coupled with the third mounting surface, and the front side of the second semiconductor chip is electrically and thermally coupled with the fourth mounting surface.

9. The apparatus according to claim 8,
wherein the fourth mounting surface is perpendicular to the fifth and sixth heat radiation surfaces.

10. The apparatus according to claim 1, further comprising:
a second semiconductor chip having a front side and a backside; and
a third heat radiation member,
wherein the first heat radiation member includes a first heat radiation surface exposed on the first surface, a second heat radiation surface exposed on the second surface, and a first mounting surface slanting with respect to the first and second heat radiation surfaces,
wherein the second heat radiation member includes a third heat radiation surface exposed on the first surface, and a second mounting surface slanting with respect to the third heat radiation surface,
wherein the third heat radiation member includes a fourth heat radiation surface exposed on the second surface, and a third mounting surface slanting with respect to the fourth heat radiation surface,
wherein the backside of the semiconductor chip is electrically and thermally coupled with the first mounting surface, and the front side of the semiconductor chip is electrically and thermally coupled with the second mounting surface, and
wherein the backside of the second semiconductor chip is electrically and thermally coupled with the third mounting surface, and the front side of the second semiconductor chip is electrically and thermally coupled with the first mounting surface.

11. The apparatus according to claim 10,
wherein the third heat radiation member further includes a fifth heat radiation surface exposed on the first surface.

12. The apparatus according to claim 11,
wherein the second heat radiation member further includes a sixth heat radiation surface exposed on the second surface.

13. The apparatus according to claim 10,
wherein the first mounting surface is perpendicular to the first and second heat radiation surfaces,
wherein the second mounting surface is perpendicular to the third heat radiation surface, and
wherein the third mounting surface is perpendicular to the fourth heat radiation surface.

14. The apparatus according to claim 1, further comprising:
a terminal coupling between an external circuit and the semiconductor chip,
wherein each of the first and second heat radiation members is exposed on both of the first and second surfaces,
wherein the first heat radiation member includes a first mounting surface, on which the chip is mounted, and an opposite surface of the first mounting surface,
wherein the first heat radiation member further includes a through hole, which penetrates from the first mounting surface to the opposite surface,
wherein the terminal includes a first end and a second end, and an insulation layer,
wherein a part of the terminal is arranged in the through hole via the insulation layer, which is disposed on a sidewall of the part of the terminal,
wherein the first end is electrically coupled with the semiconductor chip, and
wherein the second end is exposed from the resin mold, and electrically coupled with an external circuit.

15. The apparatus according to claim 1,
wherein one exposed surface of the at least one of the first and second heat radiation members is disposed on the first surface, and
wherein the other exposed surface of the at least one of the first and second heat radiation members is disposed on the second surface.

16. The apparatus according to claim 1,
wherein the front and back sides of the semiconductor chip are perpendicular to the first and second surfaces of the apparatus.

17. The apparatus according to claim 1,
wherein the at least one of the first and second heat radiation members that is exposed on both of the first and second surfaces is exposed in such a manner that each exposed portion is coplanar with the surface on which it is exposed.

* * * * *